United States Patent
Yamaji et al.

(10) Patent No.: US 7,164,205 B2
(45) Date of Patent: Jan. 16, 2007

(54) SEMICONDUCTOR CARRIER FILM, AND SEMICONDUCTOR DEVICE AND LIQUID CRYSTAL MODULE USING THE SAME

(75) Inventors: Yasuhisa Yamaji, Yamatokoriyama (JP); Kenji Toyosawa, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 187 days.

(21) Appl. No.: 10/878,541

(22) Filed: Jun. 29, 2004

(65) Prior Publication Data
US 2004/0262730 A1   Dec. 30, 2004

(30) Foreign Application Priority Data
Jun. 30, 2003   (JP)   .............................. 2003-188854

(51) Int. Cl.
*H01L 23/48*   (2006.01)
*H01L 23/52*   (2006.01)
*H01L 29/40*   (2006.01)
(52) U.S. Cl. ................... 257/766; 257/767; 257/784
(58) Field of Classification Search ................ 257/758, 257/766, 770, 784, 767, 751, 762
See application file for complete search history.

(56) References Cited

U.S. PATENT DOCUMENTS 4,226,899 A * 10/1980 Thiel et al. .................. 427/101
6,492,198 B1 * 12/2002 Hwang ........................ 438/108

FOREIGN PATENT DOCUMENTS

JP   2002-252257 A   9/2002

* cited by examiner

*Primary Examiner*—S. V. Clark
(74) *Attorney, Agent, or Firm*—Harness, Dickey & Pierce, P.L.C.

(57) ABSTRACT

A semiconductor carrier film includes (i) a base film having insulating property, (ii) a barrier layer provided on the base film, the barrier layer including nickel-chrome alloy as a main component, and (iii) a wire layer provided on the barrier layer, the wire layer being made of conductive material including copper, and a ratio of chrome in the barrier layer is 15% to 50% by weight. A semiconductor device is formed by bonding a semiconductor element to the wire layer. The semiconductor carrier film and the semiconductor device are suitable for attaining finer pitches and higher outputs, because insulating resistance between adjacent terminals is less likely to deteriorate then in conventional art even in the environment of high temperature and moisture.

9 Claims, 9 Drawing Sheets

PRIOR ART

SEMICONDUCTOR CARRIER FILM, AND SEMICONDUCTOR DEVICE AND LIQUID CRYSTAL MODULE USING THE SAME

This nonprovisional application claims priority under 35 U.S.C. § 119(a) on Patent Application No. 2003/188854 filed in Japan on Jun. 30, 2003, the entire contents of which are hereby incorporated by reference.

FIELD OF THE INVENTION

The present invention relates to a semiconductor carrier film for carrying, for example, (i) a semiconductor chip for driving a liquid crystal display device, (ii) a passive member, (iii) and the like, and relates to a semiconductor device and a liquid crystal module using the semiconductor carrier film.

BACKGROUND OF THE INVENTION

Recently, liquid crystal drivers have many functions, and their performance is getting higher. The number of outputs from liquid crystal drivers is therefore increasing. Accordingly, the pitch of carrier tapes for carrying liquid crystal drivers is rapidly getting finer. At present, COF (Chip On Film) is becoming a mainstream carrier tape, because the COF is a semiconductor carrier tape whose pitch can be finer than that of TCP (Tape Carrier Package).

A common method of assembling (manufacturing) a semiconductor device using the COF is as follows. First, metal wire is patterned by etching on a base film of polyimide. Then, the metal wire is tinned. In this way, a semiconductor carrier film is formed. After that, a semiconductor chip having a projecting electrode is bonded to the semiconductor carrier film by thermo compression. This bonding step is called "inner lead bonding (ILB)". After the ILD, underfill resin (protective material) is filled into a space between the semiconductor chip and the semiconductor carrier film. The underfill resin is then cured. Assembly of the semiconductor device using the COF is completed by a final test.

The semiconductor carrier film using the base film mainly includes a film material produced by either a casting method or a metalizing method. In the casting method, the base film material is produced by applying varnish of polyimide onto copper foil having a thickness of 12 µm to 18 µm, and curing the varnish. In the metalizing method, the base film material is produced by forming a metal barrier layer on a polyimide base material by a spattering method, and coating the metal barrier layer with copper, thereby forming a copper film (layer) which is to be a wire. In order to attain a finer pitch, it is necessary that the copper film which is to be a wire is thin. Therefore, the metalizing method is more suitable than the casting method, because it is difficult to form a thin copper film by the casting method, whereas a thin film can be manufactured by the metalizing method by simply controlling the thickness of coating. The metalizing method is disclosed in Japanese Publication for Unexamined Patent Application, Tokukai 2002-252257 (publication date: Sep. 6, 2002), for example.

FIG. 8 illustrates a cross-sectional structure of a commonly used semiconductor carrier film formed by the metalizing method. In the metalizing method, a barrier layer of nickel-chrome alloy (chrome: 7% by weight, nickel: 93% by weight) having a thickness of approximately 50 Å to 100 Å (5 nm to 10 nm) is formed by spattering on a polyimide base material 110, which is to be a base. Then, in a commonly used method, spattering copper having a thickness of 1000 Å to 2000 Å is formed, followed by electric or electroless copper plating. In this way, a copper wire layer (thickness: approximately 8 µm) which is to be a wire pattern is formed. Next, in order to form a desired wire pattern on the film base material, photoresist is applied onto the copper wire layer, and the photoresist is cured. After masking is performed in a predetermined pattern, exposing, developing, copper etching, and photoresist peeling are performed. In this way, as shown in FIG. 8, (i) a barrier layer 102 and (ii) a wire layer 103 made of copper are formed. The barrier layer 102 and the wire layer 103 have a predetermined width. After the photoresist peeling, a tin coating or a tin-and-gold coating (not shown) is formed. Finally, a necessary part of the wire is coated with a solder resist 111. As a result, a semiconductor carrier film is produced.

However, in a semiconductor carrier film formed by the conventional metalizing method, if a distance between adjacent wires (terminals) having a potential difference is short, or if the potential difference between the adjacent terminals is large due to a high output, an insulating resistance between the adjacent terminals tends to deteriorate in the environment of high temperature and moisture, because migration occurs between the adjacent terminals having the potential difference. In particular, if the wire is coated with gold, the migration is more salient because a cyan-type solution, which is used as a plating liquid, slightly remains. As a result, there is a problem that neither a finer pitch nor a higher output can be attained.

FIG. 9 illustrates a mechanism of the occurrence of the migration.

FIG. 9 is a cross-sectional view of a conventional semiconductor carrier film. On a base film 110 of polyimide, a barrier layers 102 and wire layers 103*a* and 103*b* are formed. On surfaces of the barrier layers 102 and the wire layers 103*a* and 103*b*, tin coatings 104 are formed. On the tin coatings 104, gold coatings 105 are formed. The barrier layers 102 are made of nickel-chrome alloy including 7% by weight of chrome and 93% by weight of nickel. The thickness of the barrier layers 102 is 7 nm. There is a potential difference between the wire layer 103*a* and the wire layer 103*b*. The wire layer 103*a* has a positive potential, and the wire layer 103*b* has a negative potential or a GND potential.

When the conventional semiconductor carrier film is placed in the environment of high temperature and moisture, water droplets 106 adhere to the semiconductor carrier film. The water droplets 106 include an impurity such as chlorine. The droplets 106 penetrate through a porous part of the barrier layer 102 on the side of the wire layer 103*a* (the wire layer having the positive potential). As a result, a part of the barrier layer 102 elutes, as ions, into water, and moves toward the wire layer 103*b* (the wire layer having the negative potential or the GND potential). Through a barrier layer elution part 107, the copper forming the wire layer 103*a* (the copper which is a component of the wire layer 103*a*) is eroded, thereby creating an eroded part 109. The copper forming the wire layer 103*a* also elutes toward the wire layer 103*b* (the wire layer having the negative potential or the GND potential). In particular, the erosion of copper and the elution of (i) the copper forming the wire layer 103*a* and (ii) the component of the barrier layer 102 occur easily because the cyan-type solution usually used in forming the gold coating 105 remains without completely cleaned. As a result, the migration occurs due to a copper elution part 108 and the barrier layer elution part 107, thereby deteriorating the insulating resistance between the adjacent terminals.

SUMMARY OF THE INVENTION

The present invention was made to solve the foregoing conventional problem. An object of the present invention is therefore to provide a semiconductor carrier film in which an insulating resistance between terminals is less likely to deteriorate than in conventional art even in the environment of high temperature and moisture, thereby attaining a finer pitch and a higher output, and to provide a semiconductor device and a liquid crystal module using the semiconductor carrier film.

A semiconductor carrier film of the present invention includes: a base film having insulating property; a barrier layer provided on the base film, the barrier layer being made of chrome alloy; and a wire layer provided on the barrier layer, the wire layer being made of conductive material including copper, wherein a ratio of chrome in the barrier layer is 15% to 50% by weight.

According to the semiconductor carrier film, surface resistivity and volume resistivity of the barrier layer are improved. Therefore, a current flowing in the barrier layer is weak. This prevents erosion of the copper forming the wire layer. Moreover, because a surface potential of the barrier layer is close to a standard potential, it is possible to prevent a component of the barrier layer from eluting into water. As a result, no migration occurs between adjacent terminals.

Thus, it is possible to provide a semiconductor carrier film suitable for attaining finer pitches and higher outputs because an insulating resistance between adjacent terminals is less likely to deteriorate then in conventional art even in the environment of high temperature and moisture.

For a fuller understanding of the nature and advantages of the invention, reference should be made to the ensuing detailed description taken in conjunction with the accompanying drawings.

BRIEF DESCRIPTION OF THE DRAWINGS

FIG. 1 is a cross-sectional view illustrating a semiconductor carrier film of the present invention.

FIG. 2 is a cross-sectional view of a semiconductor device of the present invention.

FIG. 3 is a graph illustrating dependency of surface resistivity and volume resistivity of a barrier layer on a ratio of chrome in the barrier layer.

FIG. 4 is a graph illustrating a surface potential in a cyan solution under different specifications of the barrier layer.

FIG. 5 is a graph illustrating etching performance of the barrier layer with respect to the ratio of chrome in the barrier layer.

FIG. 6 is a graph illustrating the etching performance with respect to a thickness of the barrier layer.

FIG. 7 is moisture dependency of a leak current value between adjacent terminals under different specifications of the barrier layer.

FIG. 8 is a cross-sectional view illustrating a semiconductor carrier film formed by a conventional metalizing method.

FIG. 9 is a cross-sectional view illustrating a mechanism of occurrence of migration.

FIG. 10 is a cross-sectional view illustrating a liquid crystal module of the present invention.

DESCRIPTION OF THE EMBODIMENTS

With reference to FIGS. 1 through 4, and FIG. 10, the following describes one embodiment of a semiconductor carrier film, a semiconductor device, and a liquid crystal module of the present invention.

Figure 1:
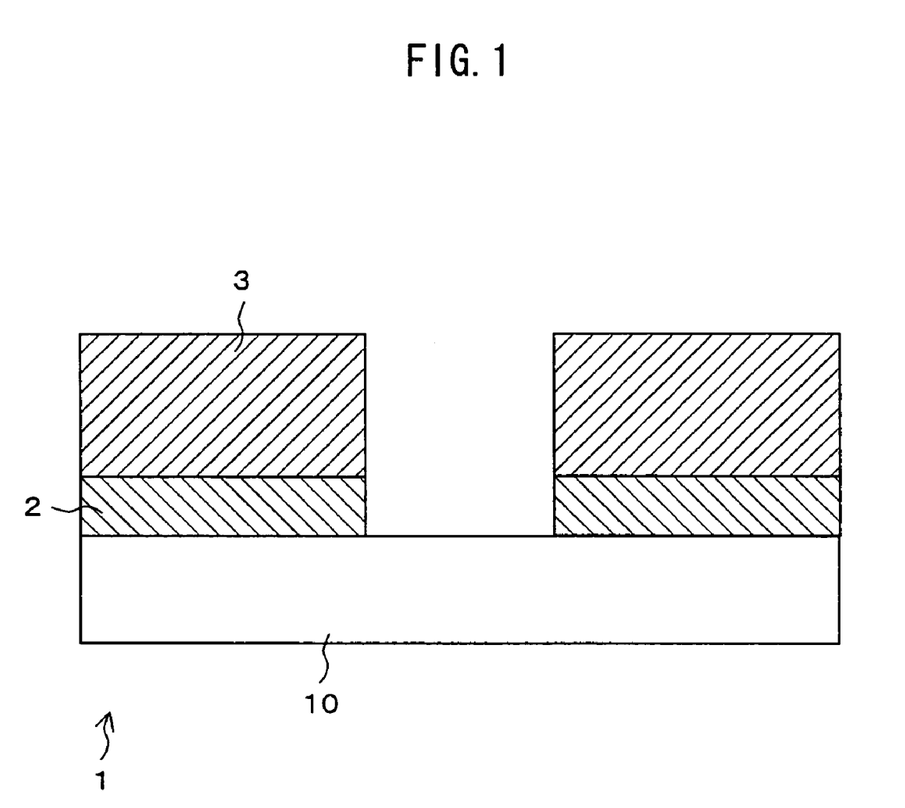

FIG. 1 is a cross-sectional view illustrating a semiconductor carrier film 1 of the present embodiment. The semiconductor carrier film 1 is structured as follows. On one side of a base film 10 (the base film 10 has an insulating property), a barrier layer 2 made of chrome alloy is formed with a predetermined thickness. On the barrier layer 2, a wire layer 3 is formed with a thickness of approximately 8 µm, for example. The chrome alloy is alloy including chrome and another metal element. One example of the chrome alloy is nickel-chrome alloy, which includes chrome and nickel. In the present embodiment, the nickel-chrome alloy is used.

The wire layer 3 is made of conductive material including copper. The barrier layer 2 and the wire layer 3 are formed in the shape of lines, thereby forming a predetermined wire pattern. FIG. 1 illustrates a cross-sectional view of the semiconductor carrier film 1 at a part where two adjacent lines are provided. On a surface of the barrier layer 2 and the wire layer 3, a tin (Sn) coating (not shown) is provided. In order to more firmly joint the coating with a semiconductor element (semiconductor chip), the coating may be a gold (Au) coating, instead of the tin coating.

The wire layer 3 is coated with insulating material such as solder resist, at a part which requires coating. This prevents, for example, short circuit between different lines.

A base body of the base film 10 is made of, for example, flexible heat-resistant resin material, preferably polyimide-type resin. The thickness of the base film 10 is preferably 25 µm to 50 µm, because the base film 10 cannot be handled easily if it is too thin, and because the base film 10 cannot be folded easily in fixing the base film 10 to another member if the base film 10 is too thick.

Figure 2:
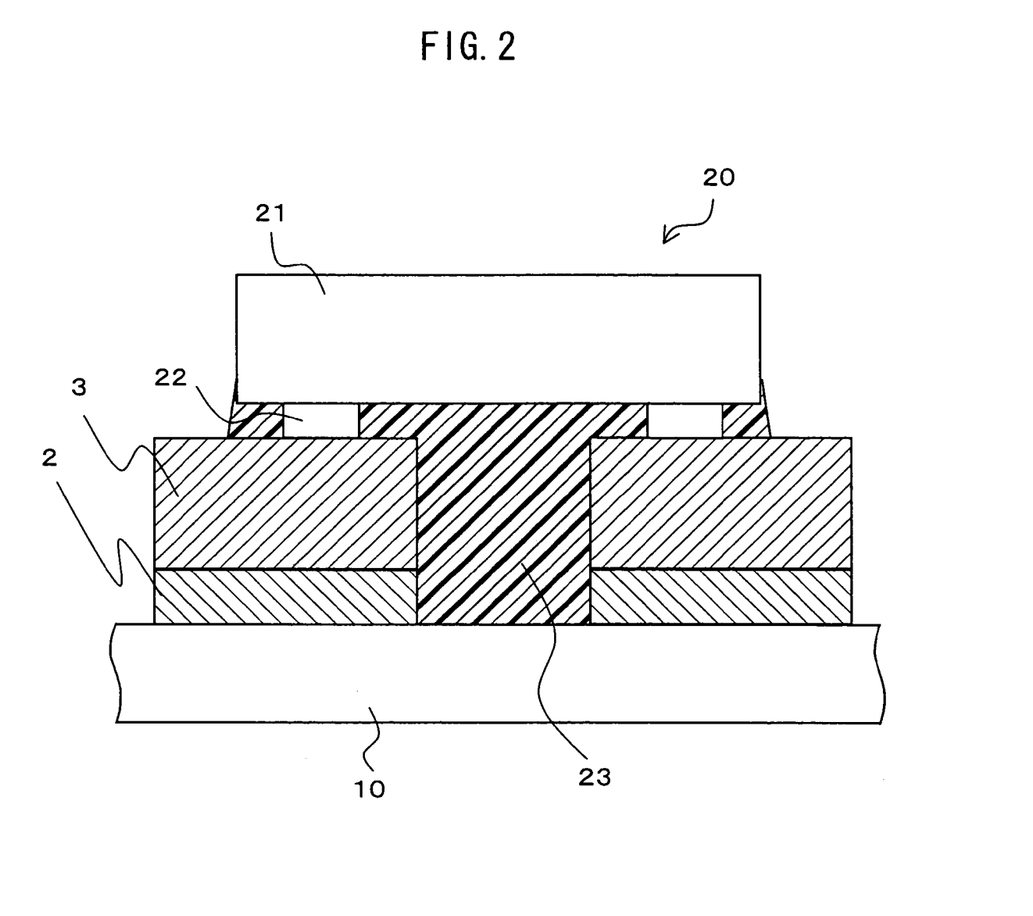

As shown in FIG. 2, a semiconductor device 20 of the present embodiment is structured as follows: a semiconductor chip and a passive member are bonded to a predetermined part of the wire pattern of the semiconductor carrier film 1, the predetermined part not coated with the insulating material such as solder resist.

A method of manufacturing the semiconductor carrier film 1 and the semiconductor device 20 using the semiconductor carrier film 1 is as follows.

Onto the base film 10, which is made of polyimide, for example, nickel-chrome alloy including nickel and chrome in a predetermined mixing ratio is attached by the spattering method, until a predetermined thickness is attained. In this way, a barrier layer 2 is formed. Then, copper is applied by spattering until a predetermined thickness is attained. After that, the copper is precipitated by electric plating, thereby forming the wire layer 3, which includes the copper. The copper may be precipitated partially by electroless plating.

Next, unnecessary parts of the barrier layer 2 and of the wire layer 3 are removed, so that the barrier layer 2 and the wire layer 3 form a predetermined wire pattern. A commonly known removal (patterning) method is etching by using photoresist, for example. By this method, it is relatively easy to form the wire pattern. On the precipitated copper, photoresist is applied, followed by drying and curing. Then, masking is performed in a predetermined pattern. Through the steps of exposing, developing, etching, and photoresist peeling, a copper wire (inner lead) is formed.

After the desired wire pattern is formed, a tin-coating layer having a thickness of, for example, 0.1 µm to 0.5 µm is formed on the surface of the barrier layer 2 and the wire layer 3. If a gold coating is provided on the tin-coating layer, the thickness of the gold coating is 0.1 µm to 0.5 µm, for example. Usually, if the gold coating is provided, a cyan-type solution is used. After that, a necessary part of the wire is coated with insulating material such as solder resist. According to these steps, the semiconductor carrier film 1 is formed.

Then, the semiconductor carrier film 1 is connected to the semiconductor chip 21 and the passive member. In the present embodiment, connection is established by the inner lead bonding (ILB) method.

In general, in the ILB method, a semiconductor chip has protruding electrodes (bumps) made of gold, and the protruding electrodes are bonded by thermo compression to a wire layer of a semiconductor carrier film, the wire layer being coated with a tin-coating layer. This causes elution of gold-tin alloy into a bonding interface between the protruding electrodes and the wire layer. As a result, the semiconductor chip and the semiconductor carrier film are electrically connected.

FIG. 2 is a cross-sectional view illustrating the semiconductor device 20 of the present embodiment. A semiconductor chip 21 has protruding electrodes 22. The protruding electrodes 22 are bonded by thermo compression to the wire layer 3, which is provided with the tin-coating layer (not shown). After the connection is established, protective material 23 such as underfill resin is filled into a space between the semiconductor chip 21 and the base film 10. The steps for manufacturing the semiconductor device 20 are completed by performing a final test.

The present embodiment is characterized in that the ratio of chrome in the nickel-chrome alloy, which forms the barrier layer 2, is increased to 15% to 50% by weight from the conventional ratio, i.e. 7% by weight. That is, the barrier layer 2 includes 15% to 50% by weight of chrome, and the rest is nickel. As a result, surface resistivity and volume resistivity of the barrier layer 2 are higher than those of the conventional barrier layer, which includes 7% by weight of chrome. This prevents the migration between adjacent wires (terminals) in the semiconductor carrier film 1, thereby preventing the deterioration of insulation between the adjacent terminals.

Figure 3:
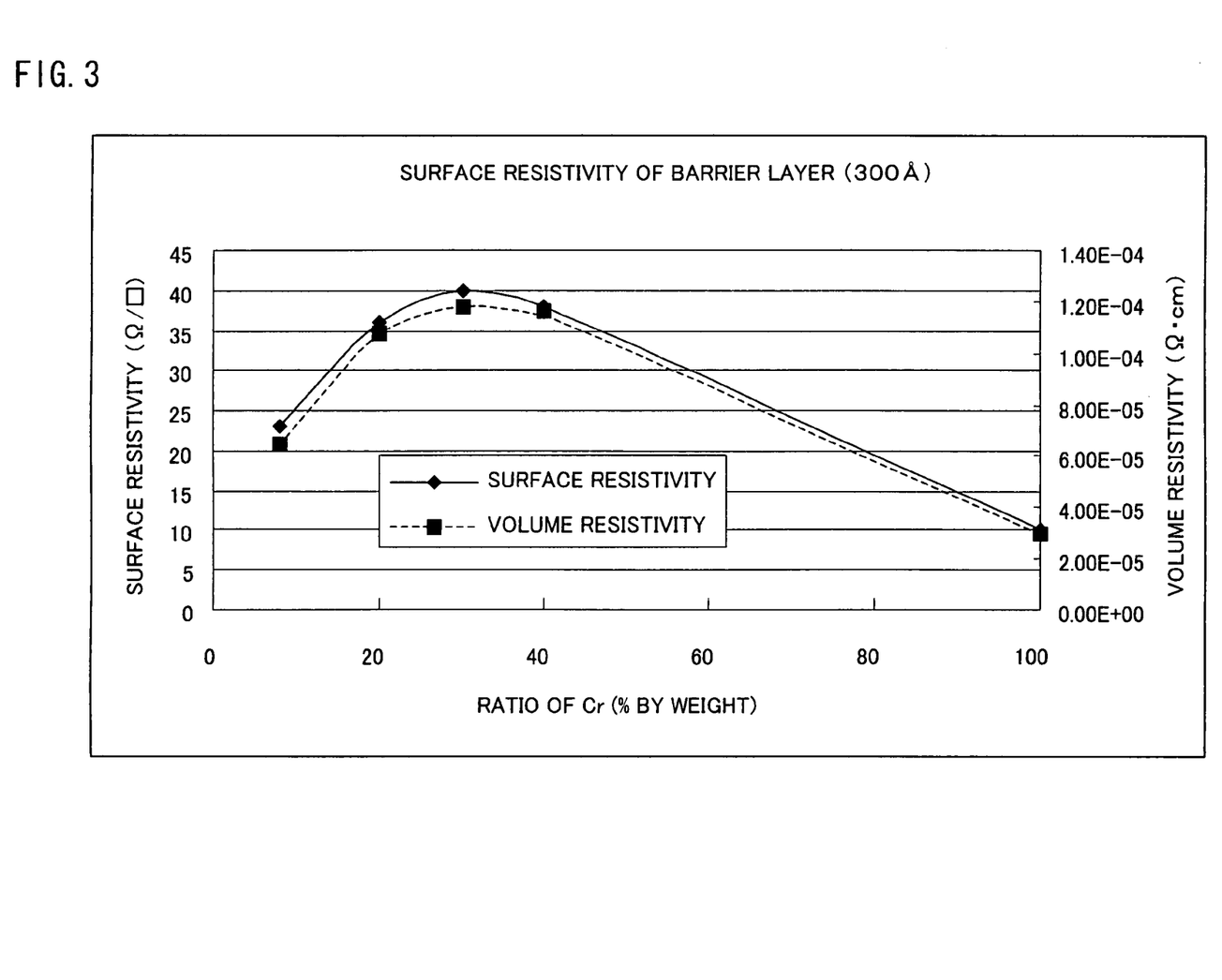

FIG. 3 is a graph illustrating the surface resistivity and the volume resistivity of the barrier layer 2 under different ratios of chrome in the nickel-chrome alloy, which forms the barrier layer 2. The thickness of the barrier layer 2 of FIG. 3 is 30 nm (300 Å). As shown in FIG. 3, the surface resistivity and the volume resistivity of the barrier layer 2 becomes maximum when the ratio of chrome is 30% by weight. FIG. 3 shows that a preferable ratio of chrome is 15% to 55% by weight. With this arrangement, the surface resistivity is not lower than 30Ω per square, which is at least 1.3 times higher than the surface resistance given by the conventional ratio, i.e. 7% by weight. If the surface resistivity and the volume resistivity are thus increased, a current flowing in the barrier layer 2 becomes weaker. This prevents chemical reactions between (i) the copper in the wire layer 3 and (ii) the impurity in the penetrating water. As a result, the erosion of copper and the elution of copper ions are prevented, and the migration is prevented.

It is more preferable if the ratio of chrome is 20% to 45% by weight. With this arrangement, the surface resistivity of the barrier layer 2 is not lower than 35Ω per square, which is at least 1.5 times higher than the surface resistance given by the conventional ratio, i.e. 7% by weight. This prevents the migration more certainly.

Figure 4:
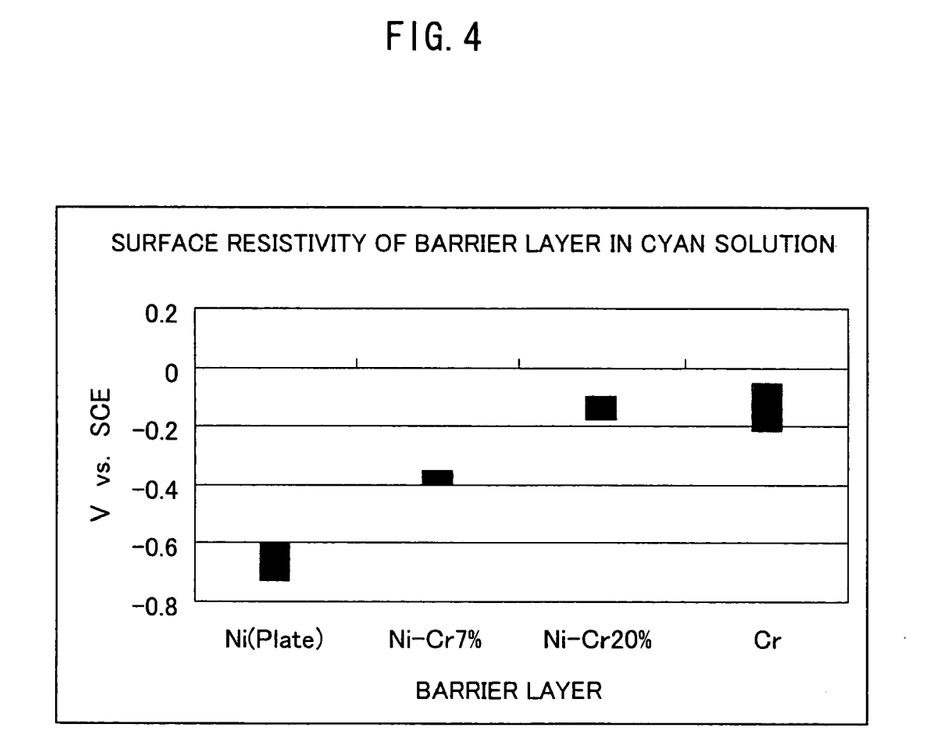

FIG. 4 is a graph illustrating the surface resistivity in a cyan solution in the barrier layer 2 under different ratios of chrome. The vertical axis is a potential with respect to a potential of a saturated calomel electrode (SCE) held at 0V.

As shown in FIG. 4, when the ratio of chrome is the conventional ratio, i.e. 7% by weight, the surface resistivity of the barrier layer 2 is approximately −0.4% vs. SCE. The surface resistivity becomes closer to approximately −0.2% vs. SCE as the ratio of chrome increases. Because a potential of a standard hydrogen electrode is approximately −0.2V vs. SCE, the surface resistivity of the barrier electrode 2 can be substantially identical to the potential of the standard hydrogen electrode if the ratio of chrome is increased. In this way, it is possible to reduce the amount of elution of metal ions from the barrier layer 2 into the water, thereby preventing the migration more certainly.

An absolute value of the surface resistivity decreases as the ratio of chrome in the barrier layer 2 increases, and this is confirmed in the cyan solution, as shown in FIG. 4. Thus, it is found that adopting 15% to 55% by weight as the ratio of chrome in the barrier layer 2 of the semiconductor carrier film 1 is also suitable in the case where the wire layer 3 is coated with gold by using an ordinary cyan-type solution.

As described later, the ratio of chrome in the barrier layer 2 is preferably not higher than 30% by weight. With this arrangement, even if etching is performed by using ordinary photoresist in forming the wire pattern, a good-product ratio (etching performance) can be kept at 80% or higher. Therefore, it is possible to improve the productivity of the semiconductor carrier film 1.

The thickness of the barrier layer 2 is preferably not less than 10 nm. This makes formation of the porous part of the barrier layer less likely, thereby preventing penetration of water. Therefore, it is possible to prevent chemical reactions between (i) the copper forming the wire layer and (ii) the impurity in the water, and to prevent the migration between adjacent terminals more certainly.

As described later, it is more preferable if the thickness of the barrier layer is not less than 35 nm. With this arrangement, ordinary etching can be performed in forming the wire pattern, and the good-product ratio can be kept at 80% or higher. Therefore, it is possible to improve the productivity of the semiconductor carrier film.

It is preferable if the barrier layer 2, which is made of chrome alloy, includes 0.1% to 5% by weight (with respect to the total weight of the barrier layer 2) of zinc as a sub component. That is, it is preferable if the barrier layer 2 is chrome-zinc alloy composed of 15% to 50% by weight of chrome, 0.1% to 5% by weight of zinc, and other metal (in this case, e.g. nickel). With this arrangement, it is possible to improve an anti-rust effect of copper, and to prevent the migration more certainly.

It is also preferable if the barrier layer 2, which is made of chrome alloy, includes 1% to 10% by weight (with respect to the total weight of the barrier layer 2) of molybdenum as a sub component. That is, it is preferable if the barrier layer 2 is chrome-molybdenum alloy composed of 15% to 50% by weight of chrome, 1% to 10% by weight of molybdenum, and other metal (in this case, nickel). With this arrangement, it is possible to prevent the elution of the nickel component of the barrier layer 2, and to prevent the migration more certainly.

Figure 10:
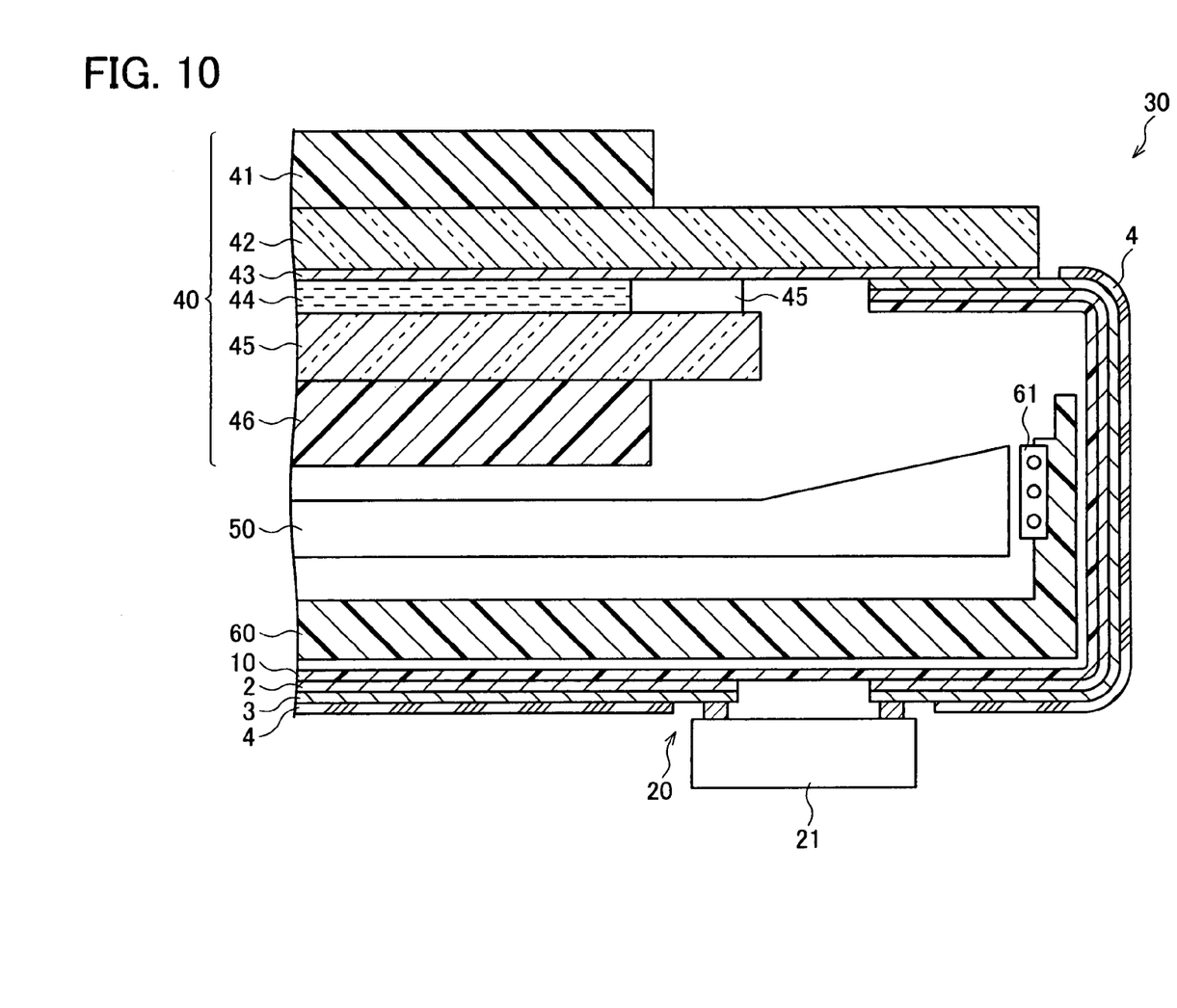

Described next with reference to FIG. 10 is a liquid crystal module 30 using the semiconductor device 20 manufactured as described above. As shown in FIG. 10, the liquid crystal module 30 of the present embodiment includes the semiconductor device 20 manufactured as described above, a liquid crystal display panel 40, an optical waveguide 50 as illumination means, and a frame 60 having an LED (Light Emitting Diode) 61 as a backlight. The LED 61 is provided face-to-face with a lateral surface of the optical waveguide 50.

The liquid crystal display panel 40 includes two polarizing plates 41 and 46, an upper glass substrate 42, a lower glass substrate 45, a liquid crystal layer 44, and a spacer 45. The upper glass substrate 42 and the lower glass substrate 45 are sandwiched between the polarizing plates 41 and 46. The liquid crystal layer 44 and the spacer 45 are sandwiched between the upper glass substrate 42 and the lower glass substrate 45. On a surface of the upper glass substrate 42, the surface facing the liquid crystal layer 44, there is provided an electrode 43 for applying a voltage to the liquid crystal layer 44.

The semiconductor device 20 is provided along the frame 60. In FIG. 10, referential numeral 4 is solder resist for coating the wire layer 3. The semiconductor chip 21 provided to the semiconductor device 20 is a liquid crystal driver integrated circuit for driving the liquid crystal display panel 40.

An end of the wire layer 3 of the semiconductor device 20 is connected to the electrode 43 of the liquid crystal display panel 40, so as to connect the liquid crystal display panel 40 and the semiconductor chip 21. This enables the semiconductor chip 21 to drive the liquid crystal display panel 40.

As described above, the liquid crystal module 30 of the present embodiment includes (i) the semiconductor device 20 and (ii) the liquid crystal display panel including the glass substrates 42 and 45, and the liquid crystal layer sandwiched therebetween. An external connection terminal of the electrode 43, the electrode 43 being provided for applying a voltage to the liquid crystal layer 44, is connected to the wire layer 3 of the semiconductor device 20. Here, the semiconductor device 20 functions as a liquid crystal driver for driving the liquid crystal display panel 40. As described above, the semiconductor carrier film of the semiconductor device 20 is highly reliable in the environment of high temperature and moisture. Therefore, the liquid crystal module 30 can operate stably even under the environment of high temperature and moisture. Thus, it is possible to improve reliability of the liquid crystal module 30.

The following describes examples of the semiconductor device 20 of the present embodiment. It should be noted that the present invention is not limited to the following examples.

EXAMPLES 1 THROUGH 11, COMPARATIVE EXAMPLES 1 AND 2

On a base film of polyimide having a thickness of 38 μm (product name: Esperflex; product of Sumitomo Metal Mining Co., Ltd.), a barrier layer 2 was formed by the spattering method. The barrier layer 2 included nickel-chrome alloy as a main component. Table 1 shows the ratio of chrome in the nickel-chrome alloy in Examples 1 through 11 and Comparative Examples 1 and 2. Table 1 also deals with other examples and comparative examples described later.

TABLE 1

|  | RATIO OF CHROME % BY WEIGHT | THICKNESS OF BARRIER LAYER nm | PITCH BETWEEN TERMINALS nm |
|---|---|---|---|
| COMPARATIVE EXAMPLE 1 | 7 | 7 | 100 |
| COMPARATIVE EXAMPLE 2 | 10 | 7 | 100 |
| EXAMPLE 1 | 15 | 7 | 100 |
| EXAMPLE 2 | 20 | 7 | 100 |
| EXAMPLE 3 | 30 | 7 | 100 |
| EXAMPLE 4 | 50 | 7 | 100 |
| EXAMPLE 5 | 20 | 10 | 100 |
| EXAMPLE 6 | 20 | 15 | 100 |
| EXAMPLE 7 | 20 | 20 | 100 |
| EXAMPLE 8 | 20 | 25 | 100 |
| EXAMPLE 9 | 20 | 30 | 100 |
| EXAMPLE 10 | 20 | 35 | 100 |
| EXAMPLE 11 | 20 | 50 | 100 |
| COMPARATIVE EXAMPLE 3 | 7 | 7 | 40 |
| EXAMPLE 12 | 20 | 15 | 40 |
| EXAMPLE 13 | 20 | 30 | 40 |
| COMPARATIVE EXAMPLE 4 | 100 | 35 | 40 |
| COMPARATIVE EXAMPLE 5 | 7 | 7 | 30 |
| EXAMPLE 14 | 20 | 15 | 30 |
| COMPARATIVE EXAMPLE 6 | 100 | 20 | 30 |

Next, on the barrier layer 2, a wire layer 3 made of copper was formed by electronic copper plating, until the thickness of the wire layer reached 8 μm. Then, photoresist was applied onto the wire layer 3, so that a wire pattern of a 100 μm-pitch between adjacent terminals (wire width: 50 μm, distance between adjacent wires: 50 μm) was formed. After that, the photoresist was dried and cured. Next, exposure was performed by using a glass photo mask, and development was performed. Unnecessary parts of the wire layer 3 and of the barrier layer 2 were removed by etching. Then, on a surface of the barrier layer 2 and the wire layer 3, a tin coating (thickness: 0.2 μm) and a gold coating (thickness: 0.2 μm) were provided. In this way, a semiconductor carrier film 1 was produced. Then, a semiconductor device 20 for evaluating reliability was produced by bonding a semiconductor chip 21 to the wire pattern of the semiconductor carrier film 1 by the ILB method.

The semiconductor device 20 was placed in a constant-temperature-and-moisture tub (product name: FH13, product of ETAC) which was set to the environmental condition of 85° C. and 85% RH. Then, a DC voltage (15V) was applied to adjacent wires (terminals), and whether or not migration occurred was judged after a predetermined time period. Whether or not migration occurred was judged by using a microscope.

Table 2 shows the result of judgment made after 100 hours and 500 hours in Examples 1 through 4 and Comparative Examples 1 and 2. Table 3 shows the result of judgment after 100 hours and 500 hours in Example 2 and Examples 5 through 11. In the tables below, "A" indicates that no migration occurred, "C" indicates that migration occurred, and "B" indicates that the unnecessary parts of the barrier layer and of the wire layer remained because the etching performed in forming the wire pattern was insufficient.

TABLE 2

| SAMPLE NAME | RATIO OF CHROME % BY WEIGHT | 100 h | 500 h |
|---|---|---|---|
| COMPARATIVE EXAMPLE 1 | 7 | C | |
| COMPARATIVE EXAMPLE 2 | 10 | C | |
| EXAMPLE 1 | 15 | A | |
| EXAMPLE 2 | 20 | A | A |
| EXAMPLE 3 | 30 | A | A |
| EXAMPLE 4 | 50 | A | C |

TABLE 3

| SAMPLE NAME | THICKNESS OF BARRIER LAYER nm | 100 h | 500 h |
|---|---|---|---|
| EXAMPLE 2 | 7 | A | A |
| EXAMPLE 5 | 10 | A | A |
| EXAMPLE 6 | 15 | A | A |
| EXAMPLE 7 | 20 | A | A |
| EXAMPLE 8 | 25 | A | A |
| EXAMPLE 9 | 30 | A | A |
| EXAMPLE 10 | 35 | A | A |
| EXAMPLE 11 | 50 | B | B |

From Table 2, it is found that in Examples 1 through 4, where the ratio of chrome was 15% to 50% by weight, no migration occurred after 100 hours, and that reliability was therefore improved as compared to Comparative Examples 1 and 2, where the ratio of chrome was 7% by weight and 10% by weight, respectively. This is associated with the fact that, as described above, the surface resistivity of the barrier layer 2 is at least 1.3 times higher than in Comparative Example 1. In Examples 2 and 3, where the ratio of chrome was 20% to 30% by weight, no migration occurred after 500 hours. This means that the deterioration of the insulating resistance between adjacent terminals is prevented more certainly.

From Table 3, it is found that in Example 2 and Examples 5 through 10, no migration occurred regardless of the thickness of the barrier layer 2. In Example 11, where the thickness of the barrier layer 2 was 50 nm, whether or not migration occurred could not be judged because, as described later, the thickness of the barrier layer 2 was too thick to completely remove the unnecessary parts, which were to be removed by etching, of the barrier layer 2 and of the wire layer 3, in forming the wire pattern.

Table 4 shows the ratio of occurrence of migration in Example 2 and Comparative Example 1 with respect to time elapsed.

TABLE 4

| SAMPLE NAME | 100 h | 240 h | 350 h | 500 h | 800 h | 1000 h |
|---|---|---|---|---|---|---|
| COMPARATIVE EXAMPLE 1 | | 9/45 | 18/45 | | 21/45 | |
| EXAMPLE 2 | 0/24 | | 0/24 | | 0/24 | 0/24 |

Thus, in Comparative Example 1, the probability of occurrence of migration was as high as 20% after 240 hours. In contrast, in Example 2, the probability of occurrence of migration was 0% even after 1000 hours.

[Evaluation of Etching Performance]

In the same manner as in Examples 1 through 11, the barrier layer 2 was formed. The barrier layer 2 was made of nickel-chrome alloy including 0% to 100% by weight of chrome, and had a thickness of 10 nm. Then, wire patterning was performed. In order to judge whether or not the unnecessary parts, which were to be removed, of the barrier layer 2 and of the wire layer 3 were certainly removed by etching, an appearance test was conducted by AOI (Automatic Optical Inspection) of etched parts, and an electric test was conducted by open/short test between terminals. That is, by the appearance test, samples still including the unnecessary parts, which were to be removed by etching, were extracted, and the electric test was conducted by using the samples. Those samples in which short circuit between adjacent terminals was found (those samples in which the resistance between adjacent terminals was lower than $10^8 \Omega$) were regarded as defective samples, and their good product ratio (etching performance) was measured.

Figure 5:
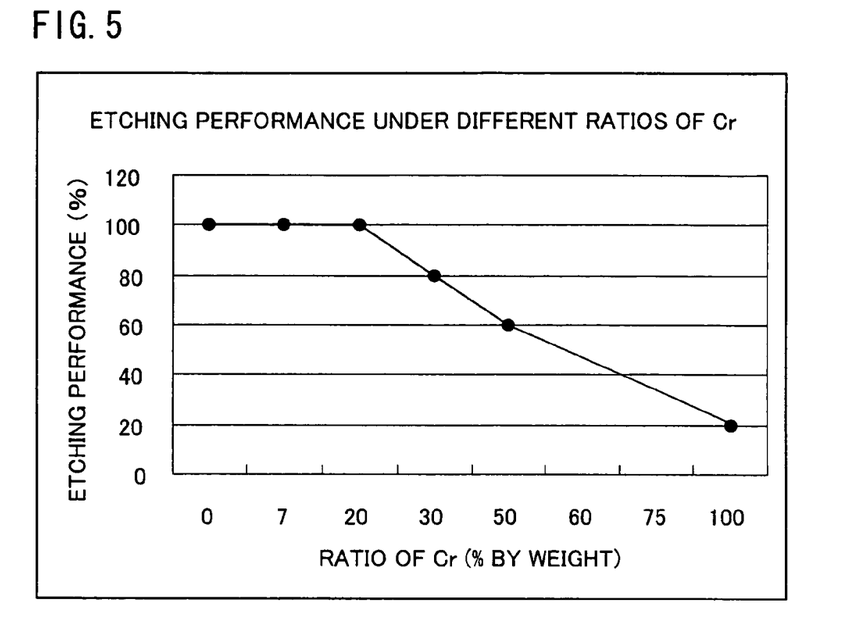

FIG. 5 shows the result of measurement of etching performance under different ratios of chrome. In FIG. 5, the vertical axis indicates the etching performance. As shown in FIG. 5, the etching performance is high (80% or higher) if the ratio of chrome was not higher than 30% by weight. If the etching performance is 80% or higher, the productivity increases. Thus, in order to remove the unnecessary parts of the barrier layer 2 and of the wire layer 3 by photoresist etching, which is a relatively simple method, it is preferable if the ratio of chrome is not higher than 30% by weight.

Figure 6:
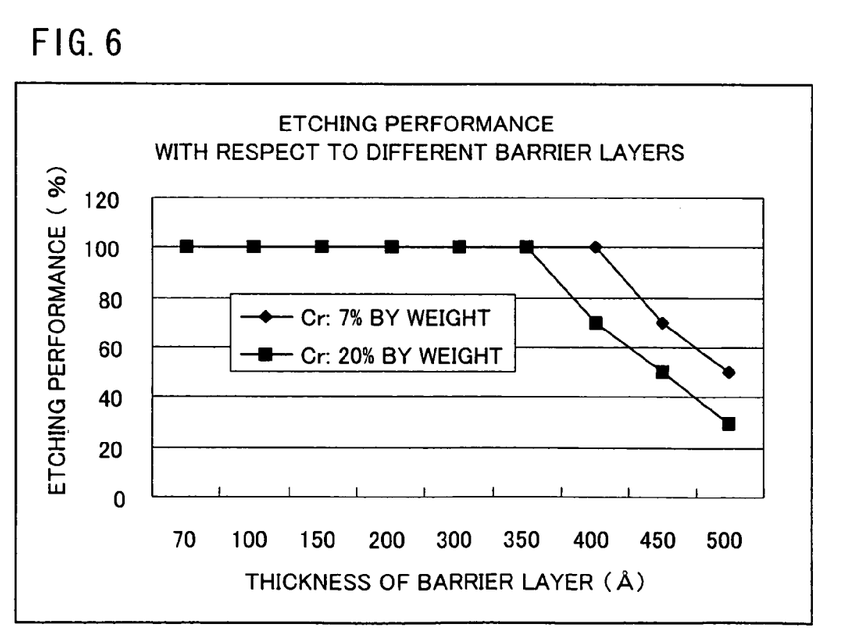

In the same manner as in Examples 1 through 11, the barrier layer 2 was formed. The barrier layer 2 was made of nickel-chrome alloy including 7% to 20% by weight of chrome, and had a thickness of 7 nm to 50 nm (70 Å to 500 Å). Then, wire patterning was performed. In this case, the etching performance was evaluated as shown in FIG. 6. As shown in FIG. 6, the etching performance was 100% if the thickness of the barrier layer 2 was not more than 35 nm (350 Å). Thus, in order to remove the unnecessary parts of the barrier layer 2 and of the wire layer 3 by photoresist etching, which is a relatively simple method, it is preferable if the thickness of the barrier layer 2 is not more than 35 nm.

The following describes examples of the semiconductor carrier film 1 of the present invention. It should be noted that the present invention is not limited to the following examples.

EXAMPLES 12 AND 13, COMPARATIVE EXAMPLES 3 AND 4

In the same manner as in Examples 1 through 11, the barrier layer 2 was formed on the base film, and the wire layer 3 was formed on the barrier layer 2. The barrier layer 2 was made of nickel-chrome alloy, and its ratio of chrome and thickness were as shown in Table 1 (see the sections of Examples 12 and 13, and Comparative Examples 3 and 4). The wire layer 3 was made of copper. Then, by the same method as in Example 2, etching was performed so as to form a comb-like wire pattern whose pitch between adjacent terminals was 40 μm (wire width: 20 μm, distance between adjacent terminals: 20 μm). In this way, the semiconductor carrier film 1 was produced. Onto a comb section, photoresist was applied in such a manner that a part of the comb section is exposed.

The semiconductor carrier film was put under the condition of normal temperature and moisture (20° C. and 25% RH), and a DC voltage (40V) was applied to adjacent terminals. Then, a leak current value between the adjacent terminals was measured by using an amperemeter. Next, each sample was placed in a constant-temperature tub (product name: KEYLESS, product of ETAC), and was left for approximately one hour while the voltage (40V) was continually applied to the adjacent terminals. Thereafter, the moisture was increased in incremental steps from the normal moisture (25% RH), and the leak current value between the adjacent terminals was measured.

Figure 7:
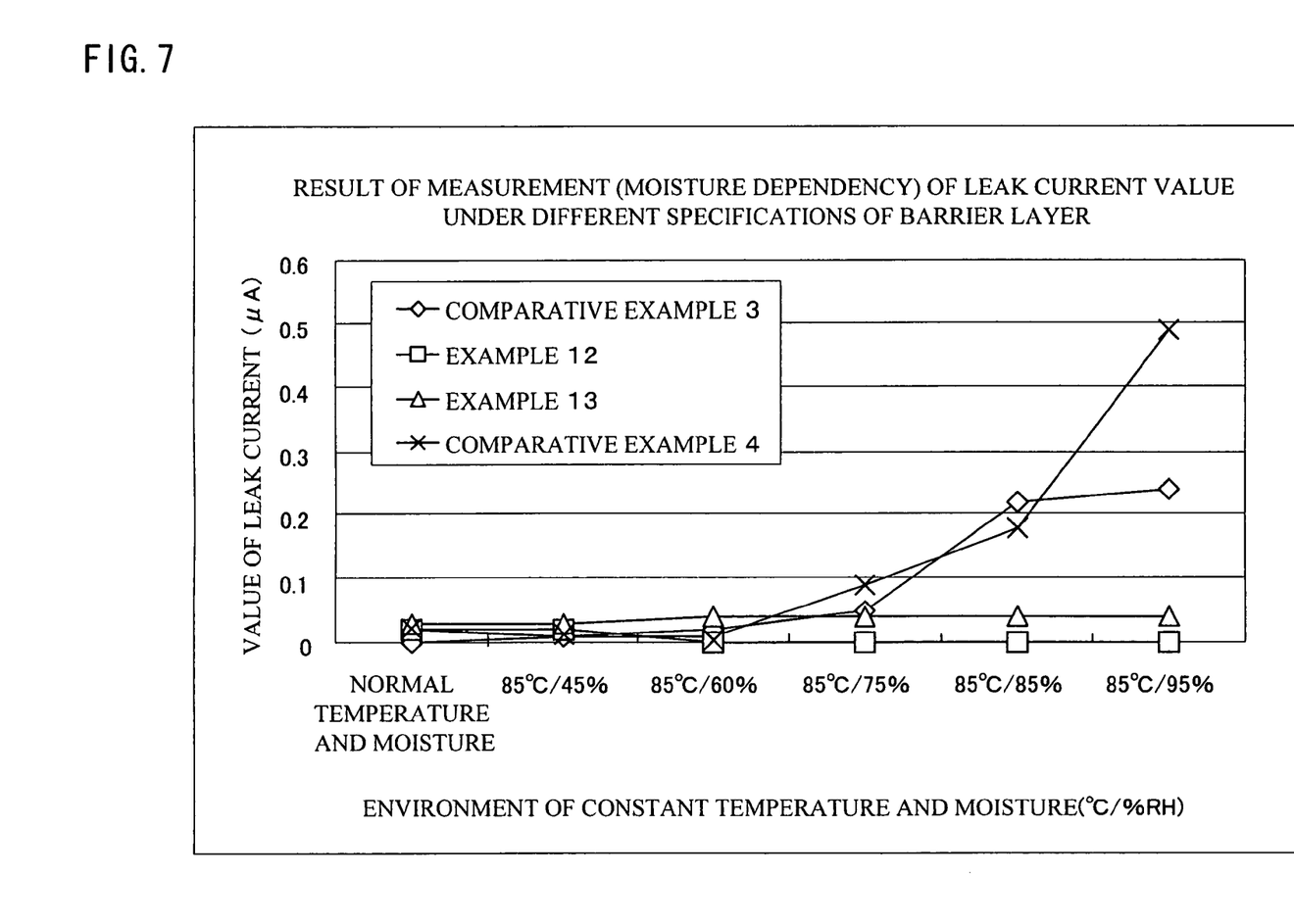
Figure 8:
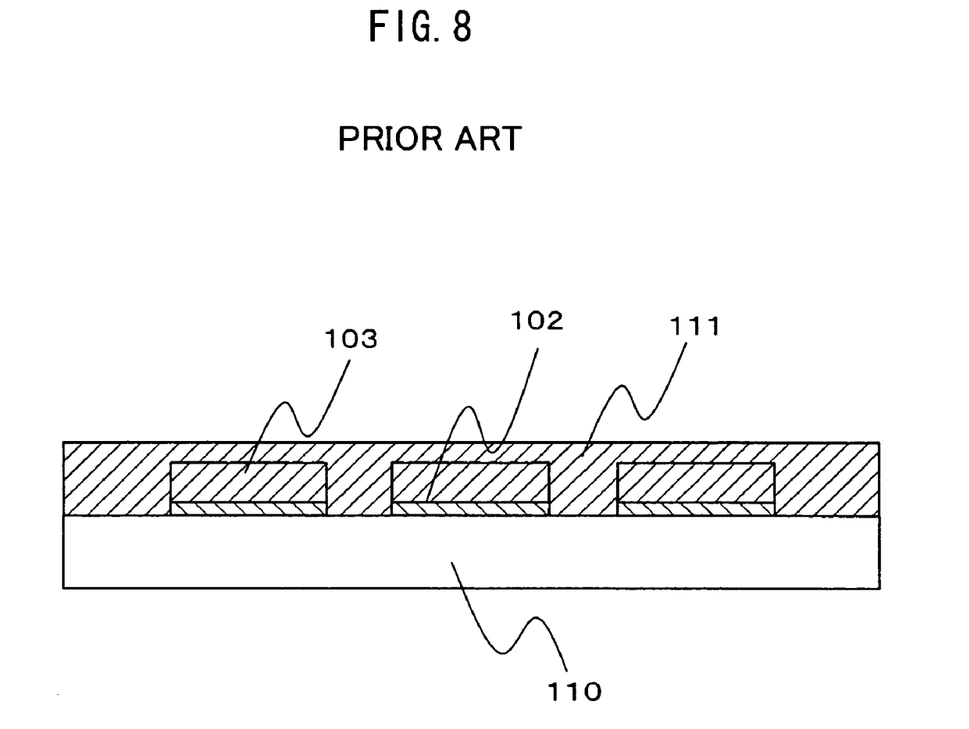
Figure 9:
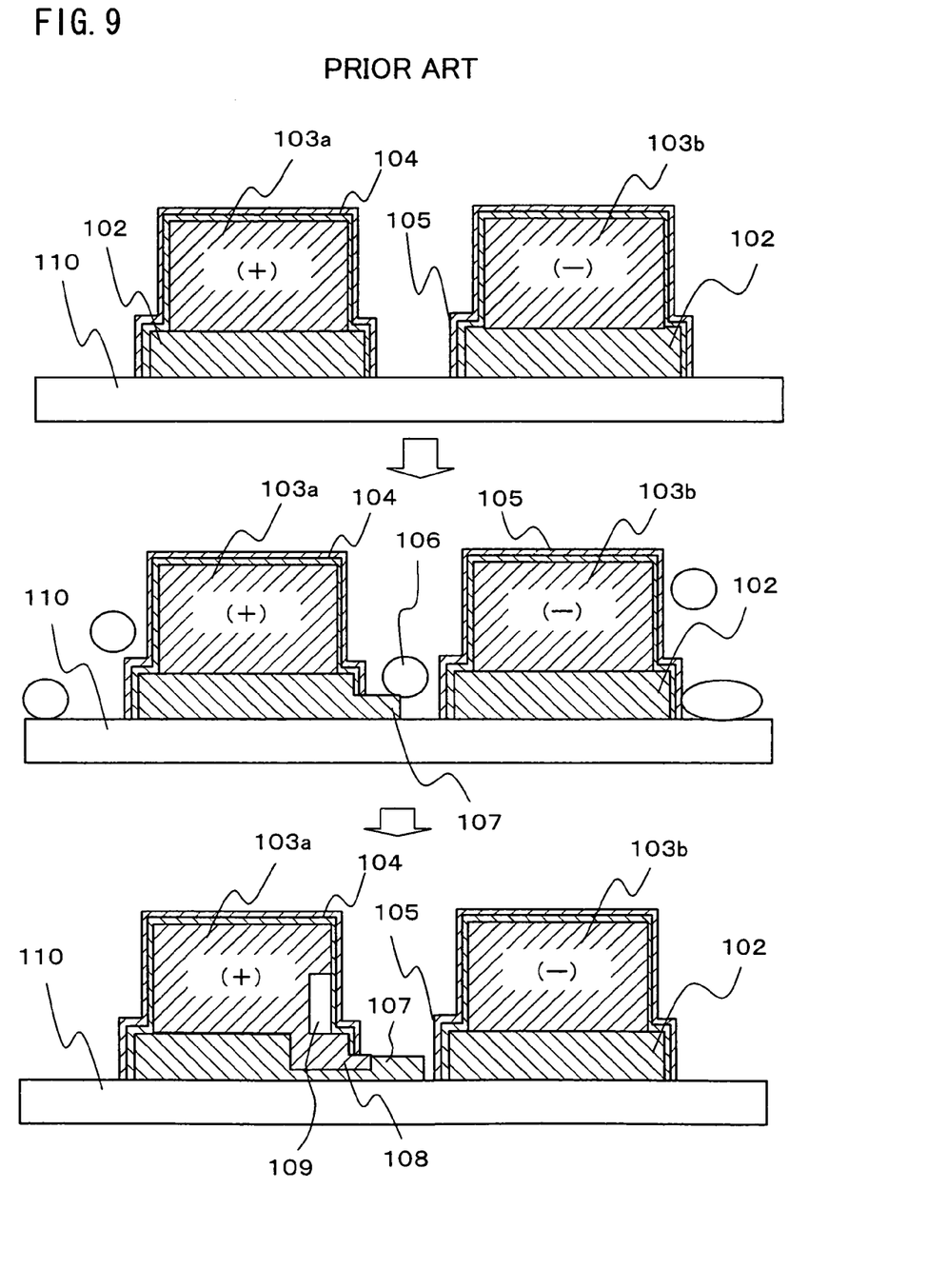

FIG. 7 shows the result of measurement. In FIG. 7, the horizontal axis indicates the environmental condition on temperature and moisture at the time of measurement, and the vertical axis indicates the leak current value between the adjacent terminals. As shown in FIG. 7, in Comparative Example 3, where the ratio of chrome was 7% by weight, and in Comparative Example 4, where the ratio of chrome was 100% by weight, the leak current value increased when the moisture was more than 60% RH. In contrast, in Examples 12 and 13, where the ratio of chrome was 20% by weight, the leak current value did not change even when the moisture was increased to 95% RH. As a result, even though the temperature increased, the insulating resistance between adjacent terminals did not deteriorate. As described above, this is because the surface resistivity of the barrier layer 2 in Examples 12 and 13 was higher than in Comparative Examples 3 and 4.

EXAMPLE 14, COMPARATIVE EXAMPLES 5 AND 6

In the same manner as in Example 12, the semiconductor carrier film 1 was produced. The ratio of chrome and the thickness of the barrier layer 2 were as shown in Table 1 (see the sections of Example 14 and Comparative Examples 5 and 6). The pitch between adjacent terminals in the comb-like wire pattern was 30 μm (wire width: 15 μm, distance between adjacent terminals: 15 μm). Three samples were produced for each example and comparative example.

The semiconductor carrier film was placed in a constant-temperature-and-moisture tub under the setting of 85° C. and 85% RH. After the DC voltage (40V) was applied to the adjacent terminals for 100 hours, 240 hours, 500 hours, and 1000 hours, whether or not erosion of copper in the wires occurred was judged by using a microscope from the reverse side of the base film. Table 5 shows the result of judgment. In FIG. 5, the denominator indicates the total number of samples, and the numerator indicates the number of samples in which erosion occurred.

TABLE 5

| SAMPLE NAME | RATIO OF CHROME % BY WEIGHT | 100 h | 240 h | 500 h | 1000 h |
|---|---|---|---|---|---|
| COMPARATIVE EXAMPLE 5 | 7 | 3/3 | 3/3 | 3/3 | 3/3 |
| EXAMPLE 14 | 20 | 0/3 | 0/3 | 0/3 | 0/3 |
| COMPARATIVE EXAMPLE 6 | 100 | 3/3 | 3/3 | 3/3 | 3/3 |

As shown in Table 5, in Comparative Example 5, where the ratio of chrome was 7% by weight, and in Comparative Example 6, where the ratio of chrome was 100% by weight, erosion was found in all samples after 100 hours. In contrast, in Example 14, where the ratio of chrome was 20% by weight, no erosion was found in any sample even after 1000 hours.

As described above, in a semiconductor carrier film of the present invention including (i) a base film having insulating property, (ii) a barrier layer provided on the base film, the barrier layer being made of chrome alloy, and (iii) a wire layer provided on the barrier layer, the wire layer being made of conductive material including copper, a ratio of chrome in the barrier layer is 15% to 50% by weight.

According to the semiconductor carrier film, the surface resistivity and the volume resistivity of the barrier layer are improved. Therefore, the current flowing in the barrier layer is weak. This prevents erosion of the copper forming the wire layer. Moreover, because the surface potential of the barrier layer is close to the standard potential, it is possible to prevent the component of the barrier layer from eluting into water. As a result, no migration occurs between adjacent terminals.

Thus, it is possible to provide a semiconductor carrier film suitable for attaining finer pitches and higher outputs because an insulating resistance between adjacent terminals is less likely to deteriorate then in conventional art even in the environment of high temperature and moisture.

It is preferable if the ratio of chrome in the barrier layer is 15% to 30% by weight.

According to this arrangement, even if etching is performed by using ordinary photoresist in forming the barrier layer and the wire layer into a desired wire pattern, the good-product ratio can be kept high (80% or higher). Therefore, it is possible to improve the productivity of the semiconductor carrier film.

It is preferable if a thickness of the barrier layer is 10 nm to 35 nm.

According to this arrangement, because the barrier layer is thick (not less than 10 nm), no porous part is created in the barrier layer. Therefore, penetration of water is prevented even in the environment of high temperature and moisture. As a result, migration is prevented more certainly. In addition, because the thickness of the barrier layer does not exceed 35 nm, the good-product ratio can be kept high (80% or higher) even if etching is performed by using ordinary photoresist in forming the barrier layer and the wire layer into a desired wire pattern. Therefore, it is possible to improve the productivity of the semiconductor carrier film.

It is preferable if a thickness of the base film is 25 μm to 50 μm.

According to this arrangement, the semiconductor carrier film is easy to handle, and easy to fold in attaching the semiconductor carrier film to another member.

It is preferable if the barrier layer includes zinc as a sub component, and a ratio of zinc in the barrier layer is 0.1% to 5% by weight.

According to this arrangement, it is possible to prevent the migration, and to improve the anti-rust effect of copper.

It is preferable if the barrier layer includes molybdenum as a sub component, and a ratio of molybdenum in the barrier layer is 1% to 10% by weight.

According to this arrangement, it is possible to prevent the migration, and to prevent the nickel component of the barrier layer from eluting.

In a semiconductor device of the present invention, a semiconductor element is bonded to the wire layer of the semiconductor carrier film.

A liquid crystal module of the present invention includes the semiconductor device.

According to this arrangement, it is possible to provide a liquid crystal module with such improved reliability as to operate stably even in the environment of high temperature and humidity.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor carrier film, comprising
a base film having insulating property;
a barrier layer provided on the base film, the barrier layer being made of chrome alloy; and
a wire layer provided on the barrier layer, the wire layer being made of conductive material including copper,
wherein an amount of chrome in the barrier layer is 15% to 50% by weight.

2. The semiconductor carrier film as set forth in claim 1, wherein:
the amount of chrome in the barrier layer is 15% to 30% by weight.

3. The semiconductor carrier film as set forth in claim 1, wherein:
a thickness of the barrier layer is 10 nm to 35 nm.

4. The semiconductor carrier film as set forth in claim 1, wherein:
a thickness of the base film is 25 µm to 50 µm.

5. The semiconductor carrier film as set forth in claim 1, wherein:
the barrier layer includes zinc as a sub component; and
an amount of zinc in the barrier layer is 0.1% to 5% by weight.

6. The semiconductor carrier film as set forth in claim 1, wherein:
the barrier layer includes molybdenum as a sub-component; and
an amount of molybdenum in the barrier layer is 1% to 10% by weight.

7. The semiconductor carrier film as set forth in claim 1, wherein:
the barrier layer is made of nickel-chrome alloy.

8. A semiconductor device, comprising
a semiconductor carrier film including (i) a base film having insulating property, (ii) a barrier layer provided on the base film, the barrier layer being made of chrome alloy, and (iii) a wire layer provided on the barrier layer, the wire layer being made of conductive material including copper; and
a semiconductor element bonded to the wire layer,
wherein an amount of chrome in the barrier layer is 15% to 50% by weight.

9. A liquid crystal module, comprising a semiconductor device including
a semiconductor carrier film including (i) a base film having insulating property, (ii) a barrier layer provided on the base film, the barrier layer being made of chrome alloy, and (iii) a wire layer provided on the barrier layer, the wire layer being made of conductive material including copper; and
a semiconductor element bonded to the wire layer,
wherein an amount of chrome in the barrier layer is 15% to 50% by weight.

* * * * *

(12) EX PARTE REEXAMINATION CERTIFICATE (9564th)
United States Patent
Yamaji et al.

(10) Number: US 7,164,205 C1
(45) Certificate Issued: Mar. 14, 2013

(54) SEMICONDUCTOR CARRIER FILM, AND SEMICONDUCTOR DEVICE AND LIQUID CRYSTAL MODULE USING THE SAME

(75) Inventors: Yasuhisa Yamaji, Yamatokoriyama (JP); Kenji Toyosawa, Ikoma (JP)

(73) Assignee: Sharp Kabushiki Kaisha, Abeno-Ku Osaka-shi, Osaka (JP)

Reexamination Request:
No. 90/009,863, Dec. 20, 2010

Reexamination Certificate for:
Patent No.: 7,164,205
Issued: Jan. 16, 2007
Appl. No.: 10/878,541
Filed: Jun. 29, 2004

(30) Foreign Application Priority Data

Jun. 30, 2003 (JP) .................................. 2003-188854

(51) Int. Cl.
*H01L 21/60* (2006.01)
*H01L 23/48* (2006.01)
*H01L 23/498* (2006.01)
*H01L 23/52* (2006.01)
*H01L 29/40* (2006.01)
*G02F 1/13* (2006.01)

(52) U.S. Cl. ... 257/766; 257/767; 257/784; 257/E23.065
(58) Field of Classification Search .................. 257/766; 315/169.1
See application file for complete search history.

(56) References Cited

To view the complete listing of prior art documents cited during the proceeding for Reexamination Control Number 90/009,863, please refer to the USPTO's public Patent Application Information Retrieval (PAIR) system under the Display References tab.

*Primary Examiner* — Erik Kielin (57) ABSTRACT

A semiconductor carrier film includes (i) a base film having insulating property, (ii) a barrier layer provided on the base film, the barrier layer including nickel-chrome alloy as a main component, and (iii) a wire layer provided on the barrier layer, the wire layer being made of conductive material including copper, and a ratio of chrome in the barrier layer is 15% to 50% by weight. A semiconductor device is formed by bonding a semiconductor element to the wire layer. The semiconductor carrier film and the semiconductor device are suitable for attaining finer pitches and higher outputs, because insulating resistance between adjacent terminals is less likely to deteriorate then in conventional art even in the environment of high temperature and moisture.

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 8, line 49:

The semiconductor device 20 was placed in a constant-temperature-and-moisture tub (product name: FH13, product of ETAC) which was set to the environmental condition of 85° C. and 85% RH. Then, a DC voltage (15V) was applied to adjacent wires (terminals), and whether or not migration occurred was judged after a predetermined time period. Whether or not migration occurred was judged by using a microscope. *In view of the electric potential difference of 15 V and the distance between adjacent wires of 50 µm, an electric field intensity of $3.0 \times 10^5$ V/m is present. The electric field intensity (E) is calculated by dividing the electric potential difference (V) between adjacent wires by the distance (d) between adjacent wires, such that E=V/d. Thus, an electric field intensity of $3.0 \times 10^5$ V/m=(15 V/50 µm)·($10^6$ µm/m).*

Column 11, line 38:

The semiconductor carrier film was placed in a constant-temperature-and-moisture tub under the setting of 85° C. and 85% RH. After the DC voltage (40V) was applied to the adjacent terminals for 100 hours, 240 hours, 500 hours, and 1000 hours, whether or not erosion of copper in the wires occurred was judged by using a microscope from the reverse side of the base film. Table 5 shows the result of judgment. In FIG. 5, the denominator indicates the total number of samples, and the numerator indicates the number of samples in which erosion occurred. *In view of the electric potential difference of 40 V and the distance between adjacent wires of 15 µm, an electric field intensity of $2.7 \times 10^6$ V/m is present. In particular, an electric field intensity of $2.7 \times 10^6$ V/m=(40 V/15 µm)·($10^6$ µm/m).*

AS A RESULT OF REEXAMINATION, IT HAS BEEN DETERMINED THAT:

Claims 1-4 and 6-9 are cancelled.

Claim 5 is determined to be patentable as amended.

New claims 10-20 are added and determined to be patentable.

5. [The semiconductor carrier film as set forth in claim 1, wherein:] *A semiconductor carrier film, comprising:*
   *a base film having an insulating property;*
   *a barrier layer provided on the base film, the barrier layer being made of a nickel-chrome alloy; and*
   *a wire layer provided on the barrier layer, the wire layer being made of a conductive material including copper,*
   wherein an amount of chrome in the barrier layer is 15% to 50% by weight, the barrier layer includes zinc as a sub component[:], and an amount of zinc in the barrier layer is 0.1% to 5% by weight.

*10. The semiconductor carrier film of claim 5, wherein a surface resistivity of the barrier layer is at least 30 Ω per square.*

*11. The semiconductor carrier film of claim 5, wherein the amount of chrome in the barrier layer is about 15% to 30% by weight.*

*12. The semiconductor carrier film of claim 5, further comprising:*
   *a tin coating layer disposed on the wire layer.*

*13. A semiconductor device, comprising:*
   *a semiconductor carrier film including (i) a base film having an insulating property, (ii) a barrier layer provided on the base film, the barrier layer being made of a nickel-chrome alloy, and (iii) a wire layer provided on the barrier layer, the wire layer being made of a conductive material including copper; and*
   *a semiconductor element bonded to the wire layer,*
   *wherein an amount of chrome in the barrier layer is 15% to 50% by weight, the barrier layer includes zinc as a sub component, and an amount of zinc in the barrier layer is 0.1% to 5% by weight.*

*14. The semiconductor device of claim 13, wherein a surface resistivity of the barrier layer is at least 30 Ω per square.*

*15. The semiconductor device of claim 13, wherein the amount of chrome in the barrier layer is about 15% to 30% by weight.*

*16. The semiconductor device of claim 13, wherein the semiconductor carrier film further includes a tin coating layer disposed on the wire layer, and the semiconductor element has bumps made of gold that contact the tin coating layer.*

*17. A liquid crystal module, comprising a semiconductor device including:*
   *a semiconductor carrier film including (i) a base film having an insulating property, (ii) a barrier layer provided on the base film, the barrier layer being made of a nickel-chrome alloy, and (iii) a wire layer provided on the barrier layer, the wire layer being made of a conductive material including copper; and*
   *a semiconductor element bonded to the wire layer,*
   *wherein an amount of chrome in the barrier layer is 15% to 50% by weight, the barrier layer includes zinc as a sub component, and an amount of zinc in the barrier layer is 0.1% to 5% by weight.*

*18. The liquid crystal module of claim 17, wherein a surface resistivity of the barrier layer is at least 30 Ω per square.*

*19. The liquid crystal module of claim 17, wherein the amount of chrome in the barrier layer is about 15% to 30% by weight.*

*20. The liquid crystal module of claim 17, wherein the semiconductor carrier film further includes a tin coating layer disposed on the wire layer, and the semiconductor element has bumps made of gold that contact the tin coating layer.*

\* \* \* \* \*